United States Patent [19]
Harvey et al.

[11] Patent Number: 5,288,529
[45] Date of Patent: Feb. 22, 1994

[54] LIQUID CRYSTAL POLYMER FILM

[75] Inventors: Andrew C. Harvey, Waltham; Richard W. Lusignea, Brighton; Leslie S. Rubin, Newton, all of Mass.

[73] Assignee: Foster-Miller Inc., Waltham, Mass.

[21] Appl. No.: 778,812

[22] PCT Filed: Jun. 18, 1990

[86] PCT No.: PCT/US90/03394

§ 371 Date: Dec. 12, 1991

§ 102(e) Date: Dec. 12, 1991

[87] PCT Pub. No.: WO90/15706

PCT Pub. Date: Dec. 27, 1990

Related U.S. Application Data

[63] Continuation-in-part of Ser. No. 367,433, Jun. 16, 1989, abandoned.

[51] Int. Cl.$^5$ .............................................. C09K 19/00
[52] U.S. Cl. ............................ 428/1; 252/299.01; 264/108; 264/176.1; 264/177.1; 264/177.16; 425/325; 425/224; 428/480
[58] Field of Search .................. 428/1, 480; 264/176.1, 264/108, 177.1, 177.16; 252/299.01; 425/325, 224

[56] References Cited

U.S. PATENT DOCUMENTS

| | | | |
|---|---|---|---|
| 3,790,326 | 2/1974 | Larsen | 425/325 |
| 4,377,546 | 3/1983 | Helminiak | 528/183 |
| 4,871,595 | 10/1989 | Lusignea | 528/373 |

FOREIGN PATENT DOCUMENTS

| | | |
|---|---|---|
| 0659706 | 3/1934 | Fed. Rep. of Germany . |
| 0659706 | 4/1938 | Fed. Rep. of Germany . |
| 53-47460 | 4/1978 | Japan . |
| 3002768 | 11/1983 | Japan . |
| 3002768 | 1/1988 | Japan . |
| 199622 | 8/1988 | Japan . |
| 2-089617 | 3/1990 | Japan . |
| 98423 | 4/1990 | Japan . |
| 8912550 | 12/1989 | PCT Int'l Appl. . |

OTHER PUBLICATIONS

Patent Abstracts of Japan; vol. 6; No. 228 (M-17) [1106], 13th Nov. 1982; & JP A-57-131-527 (Aug. 14, 1982).
Derwent Publications Ltd., London; Accession No. 90-152877 [20] & JP-A-02 098 423.
Database WPII, accession No. 90-152877.20, Derwent Publication Ltd. London & JP-A-02 098 423 (Toray) (Oct. 4, 1990).
Database WPIL, accession No. 90-143646.19, Derwent Pub. Ltd., London & JP A-02-089-617 (Mar. 29, 1990).
Patent Abstracts of Japan, vol. 13, No. 122 (M-807) Mar. 27, 1989 & JP A 63 296 920 (May 12, 1988).
Database WPIL No. 87-160412 [23]; Derwent Publications Ltd., London & JP-A-62 095 213 (Jan. 5, 1987).
Database WPIL, No. 88-351182 [49], Derwent Publications, Ltd., London & JP-A-63 264 323 (Jan. 11, 1988).
Database WPIL, No. 86-142024 [22], Derwent Publications, Ltd., London, & JP-A-61 078-863 (Apr. 22, 1986).
Database WPIL No. 88-130502 [19]. Derwent Publications, Ltd., London & JP-A-63 074-622 (May 4, 1988).
Database WPIL No. 90-143645 [19], Derwent Publications, Ltd., London & JP-A-02 089 616 (Mar. 29, 1990).

*Primary Examiner*—Ellis P. Robinson
*Assistant Examiner*—Nasser Ahmad
*Attorney, Agent, or Firm*—Ostrolenk, Faber, Gerb & Soffen

[57] ABSTRACT

A flat and nearly mechanically isotropic liquid crystal polymer film (38) can be formed by laminating two continuous biaxially oriented films. A laminate is produced having two thin outer surface portions which are oriented in one direction, and a relatively thick inner portion oriented in a transverse direction. The film may also be formed by passing a polymer through a set of three tubular rotors (30) which are concentric and having surfaces which are concentric and define inner and outer annular polymer flow channels (33, 35) between them. These rotors may rotate in the same or opposite directions. Another way to make the film is with a slit-type die (90) through which a polymer flows in one direction, while a moving band (91) passes continuously in a transverse direction. These ordered-polymer films are useful, for example, in the production of printed circuit boards.

51 Claims, 10 Drawing Sheets

SCHEMATIC REPRESENTATION OF EXTRUDED FILMS SHOWING MORPHOLOGY OF ORIENTED PBT LAYERS

Uniaxial Orientation, All Molecules Oriented in the Machine Direction

Balanced Angle Biaxial Orientation, Molecules Oriented at ±θ to the Machine Direction Planar Isotropic (Polymer Rods Lie Randomly in Film Plane)

PRINTED CIRCUIT BOARDS

MULTILAYER BOARDS
MULTICHIP MODULES
CHIP-ON-BOARD
FLEX CIRCUITS

CROSS SECTIONAL SHEAR
FLOW PATTERN

ORIENTATION THROUGH FILM
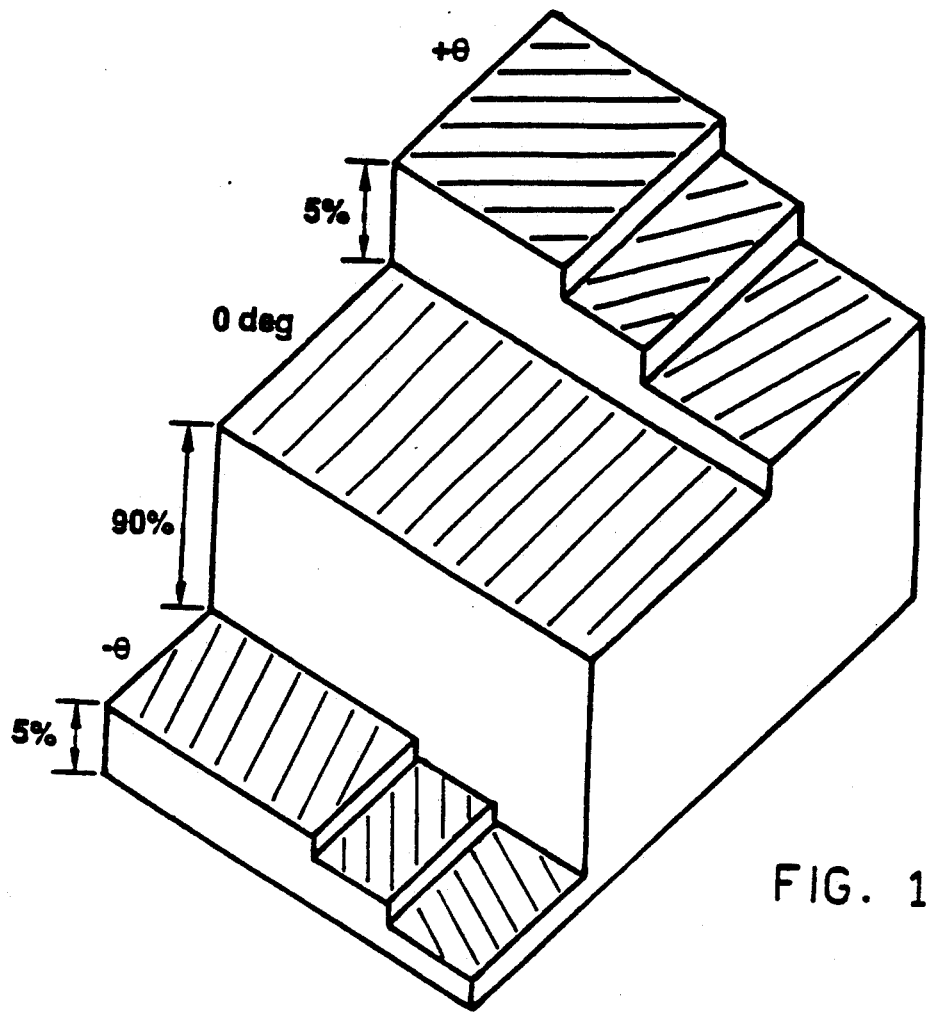
FIG. 10
FIG. 12
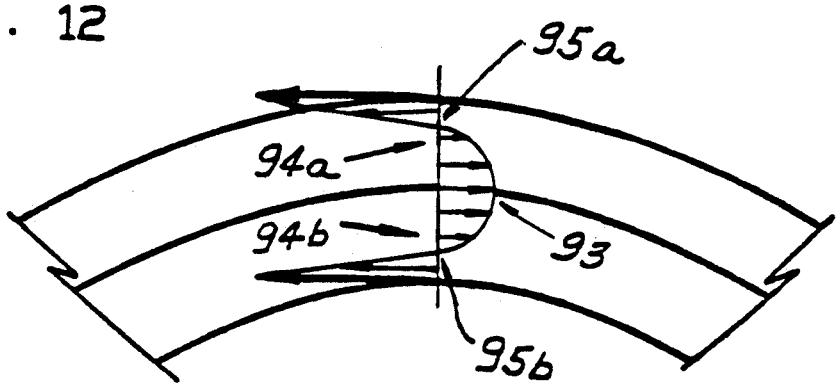

LIQUID CRYSTAL POLYMER FILM

STATEMENT OF GOVERNMENT RIGHTS

This invention was made with U.S. Government support under contract no. F 33615-88-C-5508 awarded by the U.S. Air Force. The U.S. Government has certain rights in the invention.

CROSS-REFERENCE TO RELATED APPLICATION

This is a continuation-in-part of commonlyassigned U.S Pat. Appln. Ser. No. 07/367,433 filed Jun. 16, 1989, now abandoned, which names the same inventors and is currently pending.

BACKGROUND OF THE INVENTION

1. Field of the invention

The invention relates to methods and apparatus for forming a mechanically isotropic liquid crystal polymer film. It relates more particularly to producing a film which inherently maintains its flat shape and has a more uniform coefficient of thermal expansion than has been obtainable previously. It also relates to methods and apparatus for forming a film structure comprising two relatively thin outer layers which are controllably oriented in one direction, and one or more relatively thick inner layers controllably oriented in one or more different directions.

2. Description of Related Art

The invention relates in general to the formation of multiaxially oriented films from high-molecular-weight liquid crystalline lyotropic or thermotropic polymers (homopolymers, copolymers, and the like), under processing conditions whereby the films have a controlled molecular orientation. The films of the present invention are preferably prepared from rod-like, extended-chain, aromatic-heterocyclic polymers. These polymers generally fall into two classes, those that are modified in solution form, i.e., lyotropic liquid crystalline polymers, and those that are modified by temperature changes, i.e., thermotropic liquid crystalline polymers. For a shorthand expression covering both types of polymers, the present disclosure will use the term "ordered polymers" or "liquid crystal polymers."

The ordered polymers concerned herein are believed to have a fixed molecular shape, e.g. linear, or the like, due to the nature of the monomeric repeating units comprising the polymeric chain. Linear ordered polymers are also known as "rod-like" polymers. These rod-like polymers can be blended with the more common, typical "coil-like" polymers in which the molecular chain does not have a relatively fixed shape. Some of these blends have processing and functional characteristics similar to liquid crystal polymers, and to that extent, these blends are to be considered as being included in the invention disclosed herein.

Liquid crystal polymer films have desirable qualities in a number of applications, but significant drawbacks related to their mechanical anisotropy. They are useful in particular for forming circuit substrates. Circuits can be formed on such a film by plating and etching, and then a plurality of such circuits can be laminated, to form a circuit board having multiple circuits accommodated within the board. Flexible circuits can also be formed on liquid crystal polymer films, However, the mechanical properties of liquid crystal polymer films have been inadequate for these applications. They cannot be blown and drawn after extrusion as coil polymers can, since they become too highly oriented in the die. They are too weak in the non-orientation directions to be stretched after extrusion, even while in semi-flowable form. To improve their strength, liquid crystal polymer films are typically extruded between a pair of concentric counter-rotating cylindrical dies to form a tube. This process causes the inner and outer surface layers of the tube to have different respective directions of fibrillar orientation, and this gives the tube biaxial strength and permits blowing and drawing, if desired.

FIGS. 2A-2C are schematic representations of extruder films showing the morphology of the oriented polymer material layers therein. In FIG. 2A, with no transverse or circumferential shear, the film has a uniaxial orientation, with all molecules oriented in the machine direction, that is, longitudinally with respect to the direction of flow through the die. In FIG. 2B the film has a biaxial orientation. The molecules in the top portions of the film are oriented at an angle of +theta with respect to the machine direction while the portions of the film in the lower part of FIG. 2B are oriented at an angle of —theta to the machine direction. FIG. 2C shows a planar isotropic film wherein the polymer rods lie randomly in the film plane, not strongly oriented at any specific angle with respect to the machine direction.

A biaxially oriented tube can be slit and spread apart to form a flattened film structure. However, the present inventors have observed a problem with this process which was not previously understood. The films thus formed will not lie flat. Although such a film can be flattened by pressing under heat, it has been observed that the film regains its tendency to curl as it continues to cool after pressing. Simply described, the two surface layers of the film inherently have different coefficients of thermal expansion (CTE) axially and transversely to the orientation of its molecules. Generally, the transverse CTE is greater. So as the sheet cools, each layer will try to shrink more in its own transverse direction. But since the two layers are both part of the sheet, the sheet as a whole cannot freely shrink in either direction. This stores stresses in the layers and makes the sheet bistable, whereby it is able to hold a curl about either of two different axes and readily adopts one of these two conditions if an active effort is not made to hold it flat.

As best understood, liquid crystal polymer films made of poly-(p-phenylene-benzobisthiozole) (PBZT) or the like have this curling problem because they are fibrillar, i.e., they comprise relatively straight molecules. The molecules orient strongly in the die and the flowing polymer becomes anisotropic, more so than ordinary coil polymers which tend to randomize. A coil polymer tube or sheet can be strengthened biaxially throughout its entire thickness by blowing and drawing after it exits from the die. Sometimes counter-rotating dies are also used to make conventional polymers more isotropic. But the combination of shearing and stretching is much more critical and difficult to optimize with liquid crystal polymer extrudates, since they readily become highly oriented in the die anisotropically. It may not be possible to stretch the polymer substantially in the direction transverse to its fibrillar orientation We have found that if counter-rotating annular dies are used, to establish a biaxial or multiaxial (specifically, twisted nematic) orientation of the molecules in the flow, then transverse stretching by blowing of the extruded tube is possible and effective.

But, as mentioned above, such a process forms essentially two layers in the film with complementary orientations, i.e., forming equal but opposite angles, for example +/−45°, on either side of the machine direction in which the extrusion has taken place. This has led to the drawback of curling in liquid crystal polymer film sheets made from such extruded tubes. The liquid crystal polymer films become less anisotropic due to the application of transverse shear, but they still curl after cooling, because of the non-uniform CTE phenomenon mentioned above. Curl becomes very significant when the film is orthotropic, i.e., having equal properties in orthogonal directions in the plane of the film, as in the desirable balanced biaxial film.

Another problem frequently associated with films produced by the tubular bubble process is seaming. Seams have been formed in some known methods in which film tubes are flattened or "blocked" as they are driven through pinch rolls.

These problems relate at least in part to inherent characteristics of the tubular extrusion process, and in part to the methods of system control and downstream processing, beginning with coagulation or cooling, and perhaps in part also to inadequate dope homogeneity upstream.

No techniques previously known to the art have been able to solve these problems U.S. Patent Application Ser. No. 206,137 now U.S. Pat. No. 4,963,428, filed Jun 13, 1988; Ser. No. 203,329 filed Jun. 7, 1988 now U.S. Pat. No. 4,939,235; and Ser. No. 098,710 filed Sept. 21, 1987 now U.S. Pat. No. 4,973,442; all commonly assigned herewith, disclose processes wherein biaxially oriented, substantially two-layer, liquid crystal polymer films are formed in counterrotating annular dies by controlling the transverse shear speed, the material flow rate, the blow ratio and the draw ratio, all of which affect the molecular orientation in the final product, to obtain a substantially +/−45° orientation of the two surface layers. See also U.S. Pat. Ser. No. 209,271 filed Jun. 20, 1988 now abandoned.

Nagasawa et al., Japanese Disclosure No. 53-47460, discloses a manufacturing method for a lyotropic liquid crystal polymer film which includes applying transverse shearing forces to the dope. See FIG. 2 and pp. 8-9.

Other prior art of interest includes:
Urasaki, Japanese Disclosure No. 53-86798
Sugimoto et al , Japanese Disclosure No. 54-44307
Fujii et al , Japanese Disclosure No. 63-199622
Fujii et al., Japanese Disclosure No. 63-173620
Inada et al , Japanese Disclosure No. 52-109578
Miyamoto et al., Japanese Disclosure No. 63-296920
Donald, U.S. Pat. No. 3,279,501
Sharps, Jr., U.S. Pat. No. 3,404,203
Sharps, Jr., U.S. Pat. No. 4,496,413
Isayev et al., U.S. Pat. No. 4,728,698
Helminiak et al., U.S. Pat. No. 4,377,546

These problems in the art are substantially solved by the processes and apparatus disclosed herein, namely bi-annular or tri-annular tubular dies.

Regarding the term "layer," this disclosure will relate at times to a laminated film structure comprising a number of individual intermediate-product films; and at other times to an integral film structure with different planar regions parallel to its main surfaces which are in some respects analogous to individual films, and having different properties in the various planar regions. It is to be understood that the teachings throughout this disclosure are equally applicable to both these forms of liquid crystal polymer film The use of a term such as "layer" should be understood to refer equally to a planar region within an integral film; as well as to an individual intermediate-product film, or a portion thereof, within a laminated structure.

The respective disclosures of all the prior art materials mentioned herein are expressly incorporated by reference.

SUMMARY OF THE INVENTION

Accordingly, a central object of the invention is to form a liquid crystal polymer film with nearly uniform mechanical properties, in particular a film which will lie flat and has a nearly uniform coefficient of thermal expansion in all planar directions, despite any local non-uniformity of the directional coefficients of thermal expansion in its individual layers.

Another object is to form a liquid crystal polymer film structure comprising two relatively thin outer surface portions which are oriented in a first controllable direction, and a relatively thick inner portion oriented in at least a second controllable direction and possibly partially oriented in a third controllable direction as well.

A further object is to provide methods which can be carried out by conventional apparatus with little or no modification.

Yet another object is to provide apparatus for carrying out such methods with greater control and efficiency than is obtainable with conventional apparatus.

According to one aspect of the invention, said relatively thick inner portion is controlled to have an orientation which is complementary to that of the two surface portions, the respective directions of these portions preferably defining equal and opposite angles, preferably +/−45°, with respect to the machine direction in which the extrusion is carried out.

A method of preparing this type of multiaxially oriented film from liquid crystal polymer comprises the steps of (a) subjecting axially flowing polymer material to transverse-directional motions, thereby straining the axial flow; and (b) solidifying the microscale structural orientation thus obtained.

A rotational die for extruding this type of ordered liquid crystal polymer film advantageously comprises frame means; inner, middle and outer rotors on said frame means which are concentric and have facing surfaces which define inner and outer annular polymer flow channels; means for providing a flow of polymer to each of said annular channels; and means for rotating the inner and outer rotors in a given direction and rotating the middle rotor in the opposite direction for shearing said polymer flows in said channels.

Advantageously the die also includes means for controlling the flow of polymer and the rotation of the rotors for producing a film wherein the fibrillar orientation of the polymer on one side of the midplane of the film is substantially a mirror-image of the orientation on the other side of the midplane.

Other apparatus and methods for producing this type of film are also disclosed.

Still another object is to provide a method and apparatus for including a central core layer within the relatively thick inner portion, the molecular orientation of the film structure in that central core layer being preferably in or close to the machine direction.

An additional object is to form a liquid crystal polymer film structure comprising two outer surface layers which are oriented generally in a first controllable direction; two intermediate layers respectively inward of said outer surface layers which are oriented generally in a second controllable direction; and a central core layer sandwiched between said middle layers which is oriented generally in a third controllable direction. The central core layer is preferably oriented in or close to the machine direction. The intermediate layers may have an orientation which is complementary to that of the adjacent outer layers. The respective directions of orientation of each outer surface layer and the adjacent intermediate layer thus may define equal and opposite angles with respect to the machine direction in which the extrusion is carried out. Or, the direction of orientation of each intermediate layer may be between that of the adjacent outer layer and that of the central core layer, thus providing a gradual change of direction from the outer layers to the central core layer. The respective directions of orientation of the outer surface layers and the intermediate layers preferably define equal and opposite angles with respect to the machine direction in which the extrusion is carried out.

These types of films are obtainable by at least several types of dies.

One rotational die for extruding an ordered liquid crystal polymer film comprises frame means; inner, middle and outer rotors on said frame means which are concentric and have facing surfaces which define inner and outer annular polymer flow channels; means for providing a flow of polymer to each of said annular channels; and means for rotating the inner and outer rotors in a given direction and rotating the middle rotor in the opposite direction for shearing said polymer flows in said channels.

A slit-type die assembly for extruding a balanced biaxial liquid crystal polymer film comprises a die which has a pair of opposite shorter sides and a pair of opposite longer sides and thereby defines a substantially rectangular cross-section for an axial flow of polymer, said die having slits formed in the shorter sides of said die; and a continuous belt which is movable in a continuous fashion through said slits and thereby substantially parallel to said longer sides; whereby polymer passing axially through said die is subjected to transverse-directional shearing forces by said belt passing in a first direction and transverse shear patterns formed along said longer sides in an opposite second direction.

Another rotational die for extruding an ordered liquid crystal polymer film comprises: frame means; at least inner, middle and outer mandrels on said frame means which are concentric and have facing surfaces which define inner and outer annular polymer flow channels between said mandrels, and a middle annular flow channel within said middle mandrel; means for providing a flow of polymer to each of said annular channels; and means for rotating at least the inner and outer rotors in selected directions and for shearing said polymer flows in said outer and inner channels In addition to the apparatus described herein, a rotational die having more than three rotating or non-rotating mandrels is also considered to be usable to practice the methods and obtain the products described herein.

These objects are attained by methods, apparatus, and products as disclosed and claimed herein.

The foregoing and other objects, features and advantages of the invention will be better understood from the following detailed description of preferred embodiments of the invention, with reference to the drawings.

BRIEF DESCRIPTION OF THE DRAWINGS

FIG. 10 shows the molecular orientation of the film produced by the die of FIG. 9.

FIG. 12 shows the shear pattern of the polymer flows through the device of FIG. 11.

DESCRIPTION OF PREFERRED EMBODIMENTS

First Embodiment

Figure 1:
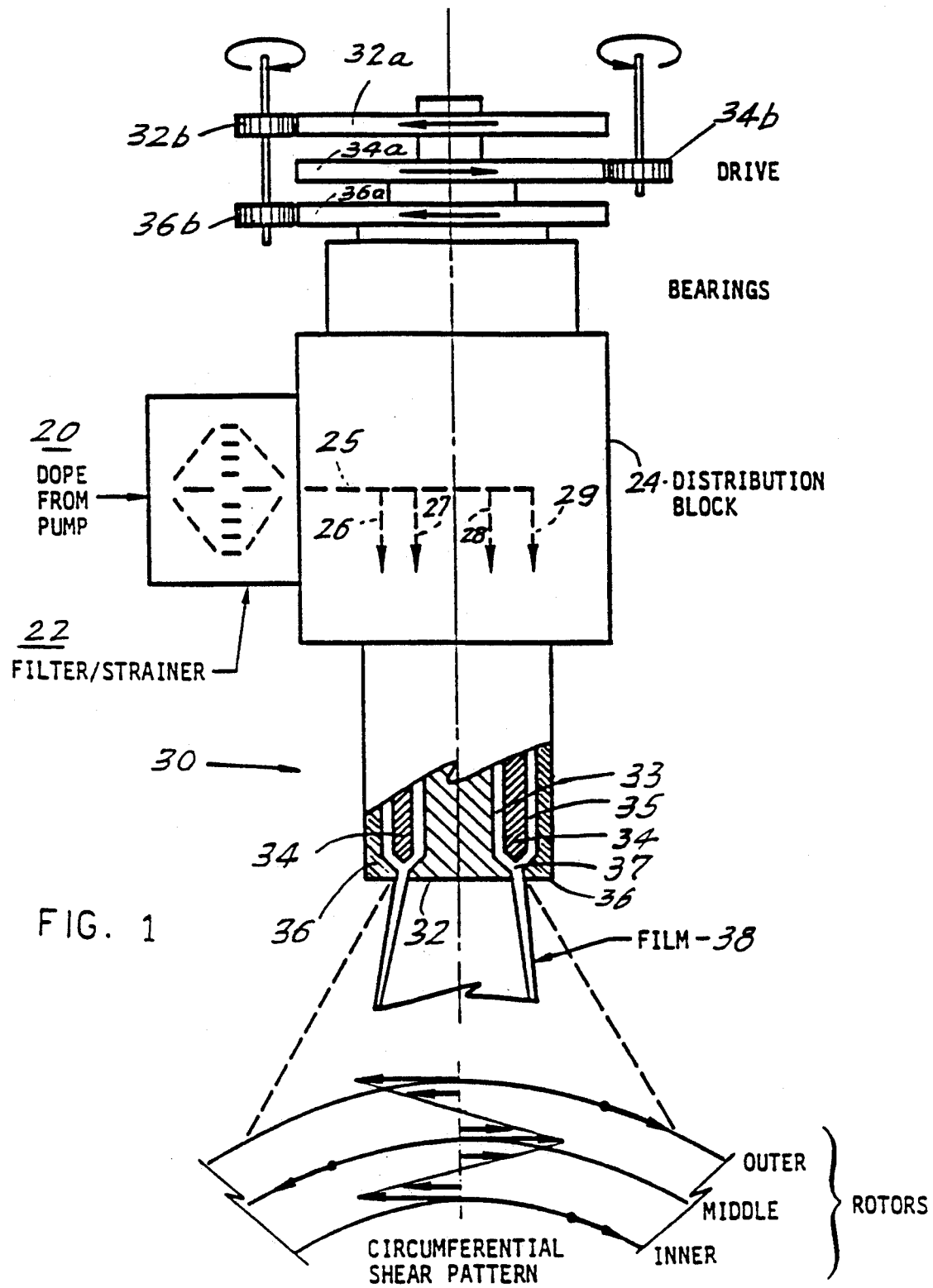
FIG. 1 is a schematic diagram, partly in cross-section, of a die that is particularly adapted to carry out the process of the invention.

FIG. 1 is a schematic diagram, partly in cross-section, of a die that is particularly adapted to carry out the process of this invention. A flowable ordered-polymer dope is introduced at an inlet 20. The dope is passed through a filter/strainer 22 which is of any suitable type and need not be discussed further at this point. The dope then passes through a distribution block 24 having a main distribution channel 25 and a group of secondary distribution channels 26-29. A die assembly generally designated 30 comprises three tubular rotors, an inner tubular rotor 32, a middle tubular rotor 34, and an outer tubular rotor 36. A cylindrical inner space or annulus 33 is defined between the rotors 32 and 34. Similarly, an outer annulus 35 is defined between the rotors 34 and 36.

After passing through the annuli 33 and 35, the two layers of the extruded dope are joined in an exit space 37 which is defined below the rotor 34 and between the lower portions of the rotors 32 and 36.

In this example, the lowermost edge of the rotor 34 has a downward-pointed shape which corresponds to the shapes of the facing inner surfaces of the rotors 32 and 36, so that the thickness dimension of the space 37 is substantially the same as that of the annuli 33 and 35 However, this arrangement is not essential. Other examples of advantageous structures can be found by experimentation, and some will be discussed hereinbelow.

As a result of the joining of the respective ordered-polymer flows in the space 37, a tubular film 38 is formed and extruded downwardly, and outwardly of a channel 40 through which air is conducted for blowing the film. A rotary fitting can be provided, for example, at some point along the channel 40 for introducing the blowing air.

The inner and outer rotors 32, 36 are rotated in a first direction, for example, clockwise as seen from above in this example. The intermediate rotor 34 is rotated in the opposite direction, namely counterclockwise as seen from above in this example. The rotors 32, 34, 36 are connected to corresponding coaxial gears 32a, 34a, 36a. The gears in turn are by corresponding pinions 32b, 34b, 36b. Advantageously, in this embodiment, the pinions 32b, 36b may be mounted on a common axis, since they rotate in the same direction so as to rotate the rotors 32 and 36 in the same direction.

The circumferential shear pattern of the resulting film 38 is illustrated at the bottom of FIG. 1. As seen, the facing layers of the polymer flows in the annuli 33, 35 are sheared in the second direction by the rotation of the middle rotor 34, so when joined in the space 37, these surfaces combine to form a central portion of the resulting film which thus is oriented strongly toward the second direction. Conversely, the rotation of the inner and outer rotors causes the inner surface of the flow in the annulus 33, and the outer surface of the flow in the annulus 35, to be oriented in the first direction These two layers form the outer layers of the resulting film.

It should be understood that the circumferential shear pattern illustrated at the bottom of FIG. 1 has a combined effect with the longitudinal shear pattern in the machine direction which results from the downward movement of the polymer flows toward the exit space 37. This longitudinal shear will be the same at each interface, between the polymer flows in the annuli 33, 35, and the rotors 32, 34, 36.

The output of this extrusion process is, for example, a biaxially oriented polybenzobisoxazole (PBO) or polybenzobisthiazole (PBZT) film having outstanding strength and thermal stability. By adjusting the relative speeds of rotation of the rotors, the flow speed of the polymer dope, and other parameters, a wide range of mechanical properties and biaxial orientations can be obtained. The PBZO or PBT films have high strength and stiffness. Also, the coefficient of thermal expansion can be made remarkably uniform in all axes of the film. Particularly with the lyotropic liquid-crystalline rod-like polymer PBZO, the resulting films are especially attractive because of their high thermal and chemical stability and their extremely high tensile mechanical properties.

Thermotropic polymers that may advantageously be used include the para-oriented aromatic polyesters, such as Vectra TM, manufactured by Celanese Corp., and Xydar TM, formerly manufactured by Dartco Mfg., Inc., and now manufactured by Amoco, Inc.

Figure 3:
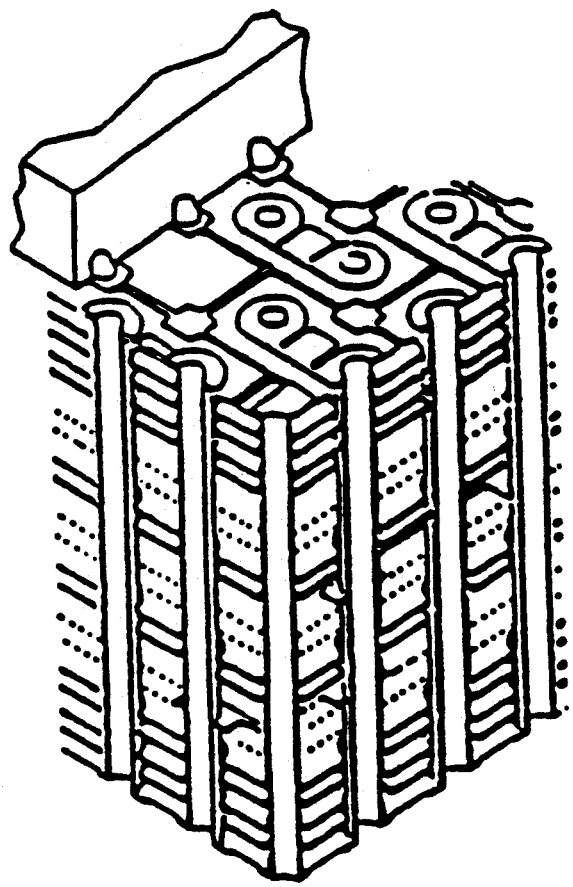
FIG. 3 shows an example of a printed circuit board comprising ordered-polymer films produced according to the invention.

FIG. 3 shows an example of a printed circuit board comprising ordered-polymer films produced according to the present invention See U.S Pat. No. Application Ser. No. 209,281 filed Jun. 20, 1988, incorporated by reference, which relates to printed circuit boards and methods for their production Materials produced in accordance with the present invention are particularly useful for making such circuit boards.

Figure 4:
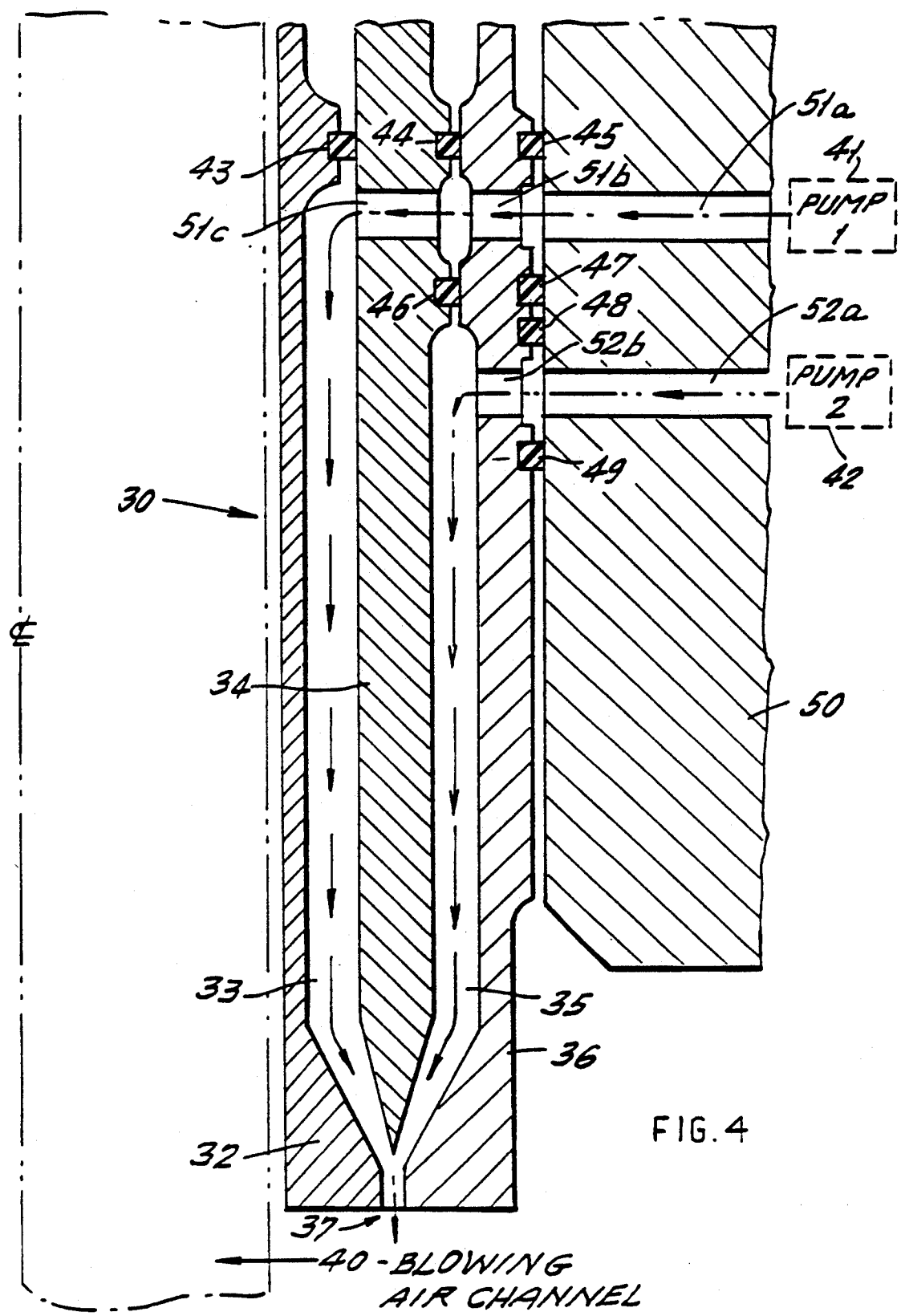
FIG. 4 is a detailed view showing in cross-section aspects of a die assembly according to the invention.

FIG. 4 is a detailed view showing in crosssection other aspects of the die assembly 30 according to the invention. The inner rotor 32 rotates about a blowing air channel 40 Polymer material is provided to the inner annulus 33 by a first pump 41. Polymer material is provided to the outer annulus 35 by a second pump 42.

The inner annulus 33 is defined below a seal 43 between the inner rotor 32 and the middle rotor 34. A passage is provided from the pump 41 to the annulus 33, through the surrounding support structure illustrated schematically at 50, through a passage 51a. A further passage is defined by a pair of seals 45, 47 between the support structure 50 and the outer rotor 36, a passage 51b defined in the outer rotor 36, a pair of seals 44, 46 between the outer rotor 36 and the middle rotor 34, and a passage 51c in the middle rotor 34.

Similarly, polymer is provided by the pump 42 to the annulus 35 through, first, a passage 52a in the support structure 50, and a further passage defined by a pair of seals 48, 49 between the support structure 50 and the outer rotor 36, and a passage 52b formed in the outer rotor 36.

Conventional bleeding means can advantageously be provided from any dead space, for example the annular space between the seals 47 and 48, to the exterior.

Figure 5:
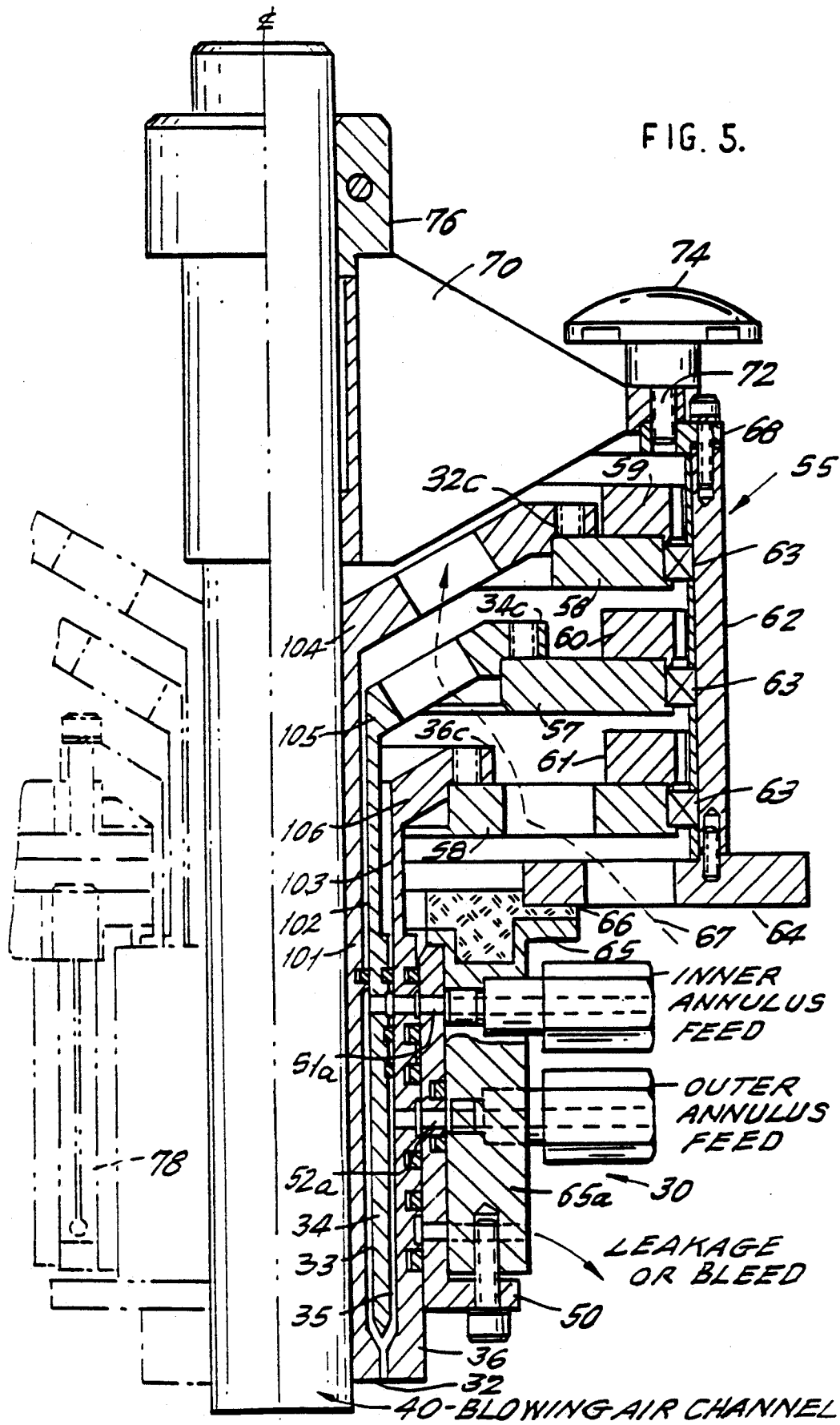
FIG. 5 is a cross-sectional view of the die assembly as well as a bearing assembly.

FIG. 5 is a cross-sectional view of the die assembly 30 as well as a bearing assembly generally designated 55 As seen in FIG. 5, the rotors 32, 34, 36 are extended upward, concentric with the air channel 40, by cylindrical extension portions 101, 102, 103. The extension portions are further extended by corresponding flange portions 104, 105, 106. These flange portions have the shape of conically oriented rings extending outward from the common axis of the rotors and the channel 40, and in this embodiment, at an angle upwardly. As shown, in this example the flange portions are generally parallel to one another.

The flange portions are further extended by horizontal mounting portions 32c, 34c, 36c. These mounting portions in turn are mounted by screws or the like to respective mounting rings 56, 57, 58. In turn, respective gear wheels 59, 60, 61 are mounted on the top of radially outward portions of the mounting rings 56, 57, 58. The function of the gear wheels will be discussed further below.

Outwardly of the gear wheels and out of contact therewith, an enclosure for the bearing assembly is formed by a seamless metal cylinder 62 or the like. Ball bearings 63 or the like are mounted between the mounting rings 56, 57, 58 and the cylinder 62. A bottom cover 64, generally plate-like, is secured to and supports the bottom of the cylinder 62. The bottom cover 64, in turn, is supported by the outer, top surface of a generally cylindrical die cover 65 which surrounds the support structure 50 (see FIGS. 4 and 5) and thereby surrounds the rotors and associated structure.

An insulating ring 66 is supported on the die cover 65 and prevents thermal conduction from the die block to the bearing and drive system. As shown by the arrow 67, cooling air can pass freely through respective holes, slots or the like in the flange portions 32b, 34b, the mounting ring 58, and the bottom cover 64, for example by natural or forced convection. Secured to the top of the cylinder 62 is a top ring 68 and supported thereon is a top bearing cover 70. The top bearing cover 70 is secured to the top ring 68 by a screw 72 or the like which is operable by a hand knob 74. A bushing 76 or the like which is mounted to the top bearing cover 70 defines, at least in part, the air channel 40.

Referring again to FIG. 5, the mounting portions 32c, 34c, 36c of the rotors 32, 34, 36 are radially staggered. That is, the mounting portion 32c extends radially farther outward than the mounting portion 34c, which in turn extends radially farther outward than the mounting portion 36c. Correspondingly, the mounting ring 58 extends radially farther inward from the bearings 63 than does the mounting ring 57, which in turn extends radially farther inward than the mounting ring 56. By this structure, after removal of the cover 70, the rotors can easily be removed individually if necessary for any reason.

Further, the entire combination of the bearing assembly 55 together with the rotors 32, 34, 36 can easily be removed as a unit from the die cover 65, simply by removal of the screws that secure the die cover 65 to the bottom cover 64. Thus, repair of the die assembly and the like can be easily accomplished without disturbing the polymer supply arrangement including the channels 51a, 52a and corresponding channels associated with the die cover 65 and appropriate fittings. Also undisturbed by removal of the rotors will be the electric heater 78, also shown in FIG. 5, which again is disposed within the die cover 65, for heating the entire die assembly 30. The heater 78 is secured in the insulating ring 66 by a bushing or the like 80. An electrical conductor 81 is provided for supplying power to the heater 78.

An advantageous feature of the arrangement in FIG. 5 is that the heater 78, the polymer supply facilities and the die portions of the rotors are all disposed in the lower part of the apparatus, beneath the bottom cover 64, the insulating ring 66 and beneath the top surface of the die cover 65. Thus, all heat generating components in the case of thermotropic polymers, or solvents in the case of lyotropic polymers, are localized in the lower part of the apparatus, which prevents any adverse effect on the bearing assembly and the drive assembly.

Figure 6:
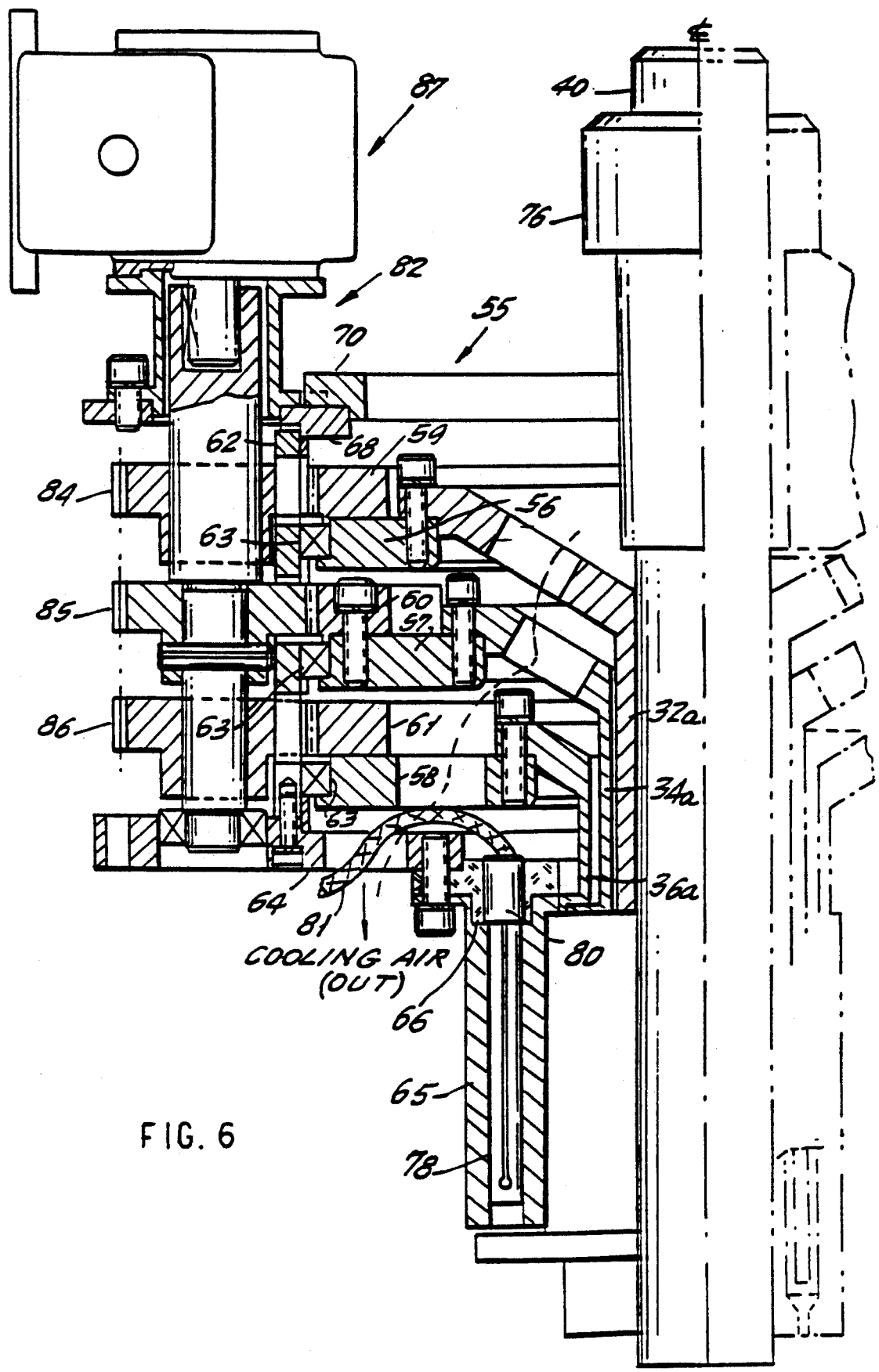
FIG. 6 shows further details of the bearing assembly and also shows a drive assembly.

FIG. 6 shows further details of the bearing assembly 55 and the drive assembly 82. Slots or the like are formed in the cylinder 62 adjacent to the gear wheels 59, 60, 61. Respective pinions 84, 85, 86 are disposed outwardly of and engaging the gear wheels 59, 60, 61 so as to rotate the gear wheels and correspondingly rotate the rotors. An assembly 87 which may comprise a motor, a reduction gear, and the like is mounted above and partly supported on the top ring 68 and drives the pinion 84. Preferably two additional motors, reduction gears, and the like are provided for independently driving the pinions 85, 86. Three separate motors are expected to give the best control over the rotor speed for finely adjusting the shearing forces applied to the polymer.

Second Embodiment

Figure 2A:
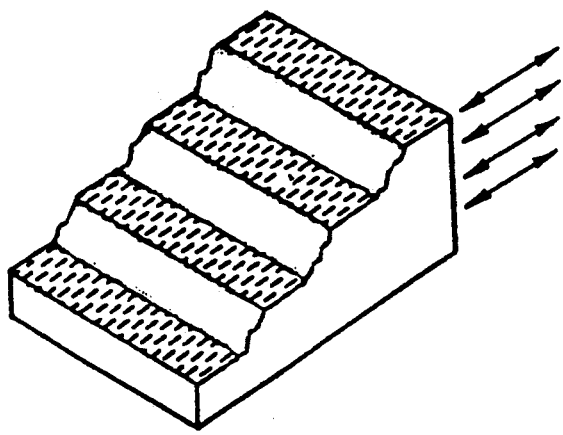
FIGS. 2A-2C are schematic representations of extruder films showing the morphology of the oriented polymer material layers therein.
Figure 2B:
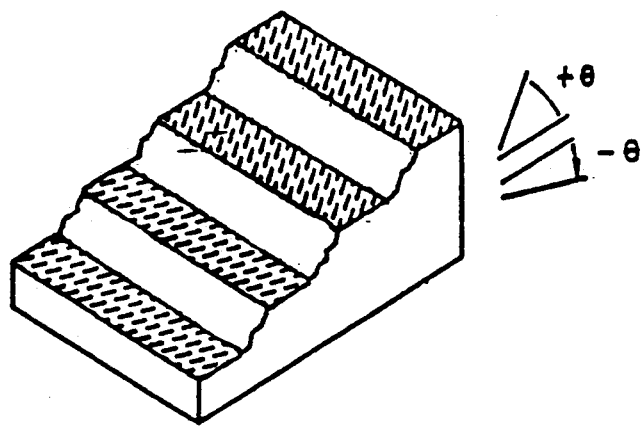
Figure 2C:
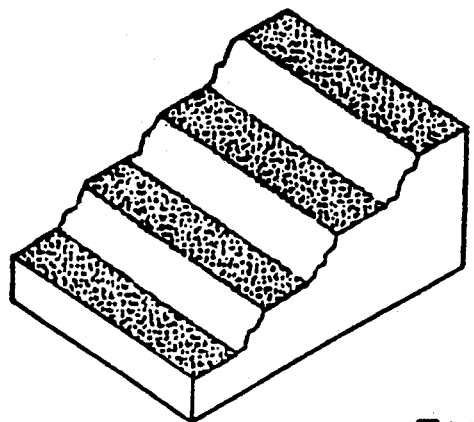

According to another aspect of the invention, the advantageous type of shear pattern similar to that shown in FIG. 1 can be obtained by another method. A conventional extrusion die which has two counter-rotating mandrels is known to produce a balanced biaxial film as shown in FIG. 2B. We have discovered that conventional film-layering and film-adhesion apparatus and methods can be used to combine two such layers and thereby obtain a combined film having the shear pattern of FIG. 2B.

Third Embodiment

Figure 7:
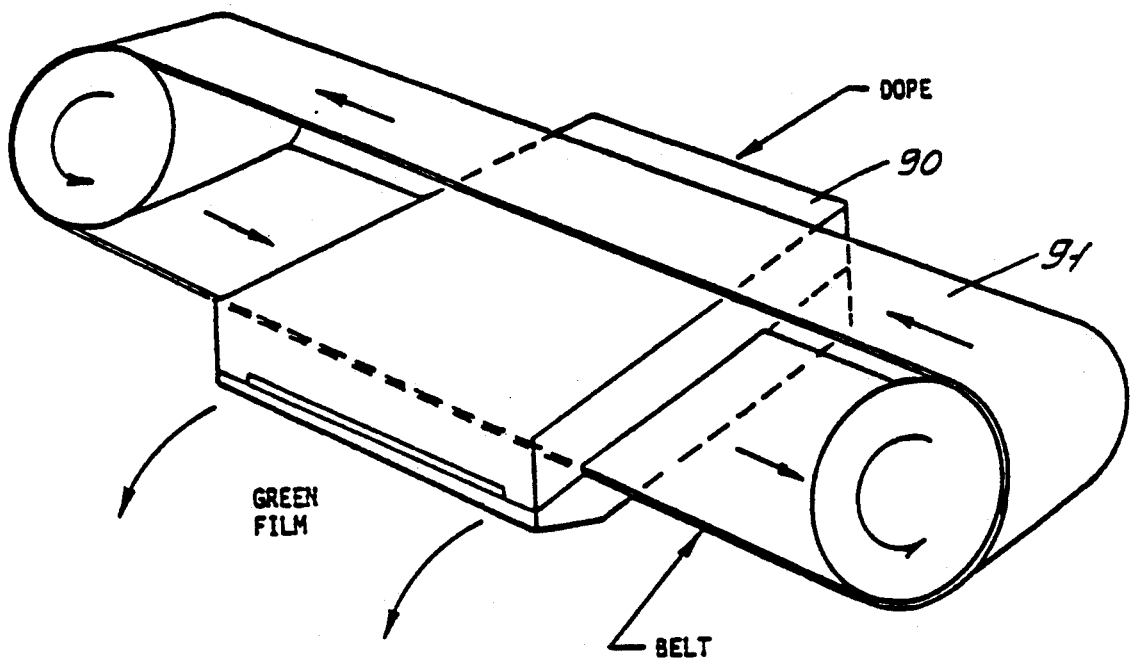
FIG. 7 shows another form of die that can be employed to obtain the film product according to the invention.
Figure 8:
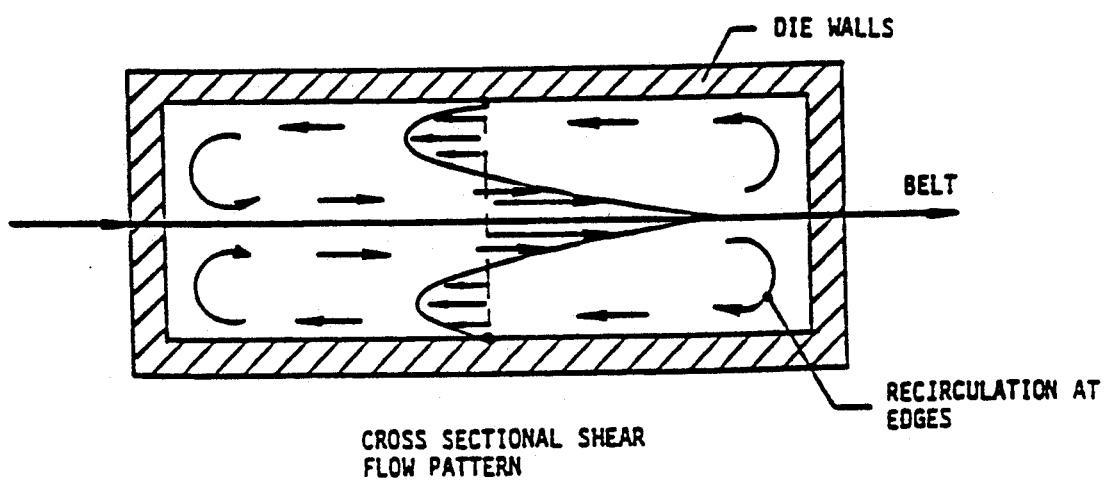
FIG. 8 shows the shear pattern in a relatively thick middle layer of polymer flow which forms the film product of the invention.

FIG. 7 shows another form of die that can be employed to obtain the film product according to the invention, namely a slit die comprising a moving belt. Other types of slit dies are known but the combination of a slit die 90 and an endless belt 91 passing continuously through the die substantially at its middle is a highly advantageous feature of the invention and has not been known to the art. A continuous flat stainless steel belt traverses the slit die flow path, setting up a strong transverse shear pattern in a relatively thick middle layer of the flow, as shown in FIG. 8. Recirculation of the polymer material at the lateral sides of the die then sets up a flow pattern whereby relatively thin surface layers at the top and bottom of the die are subjected to a shear opposite to that at the middle of the die.

Fourth Embodiment

Figure 9:
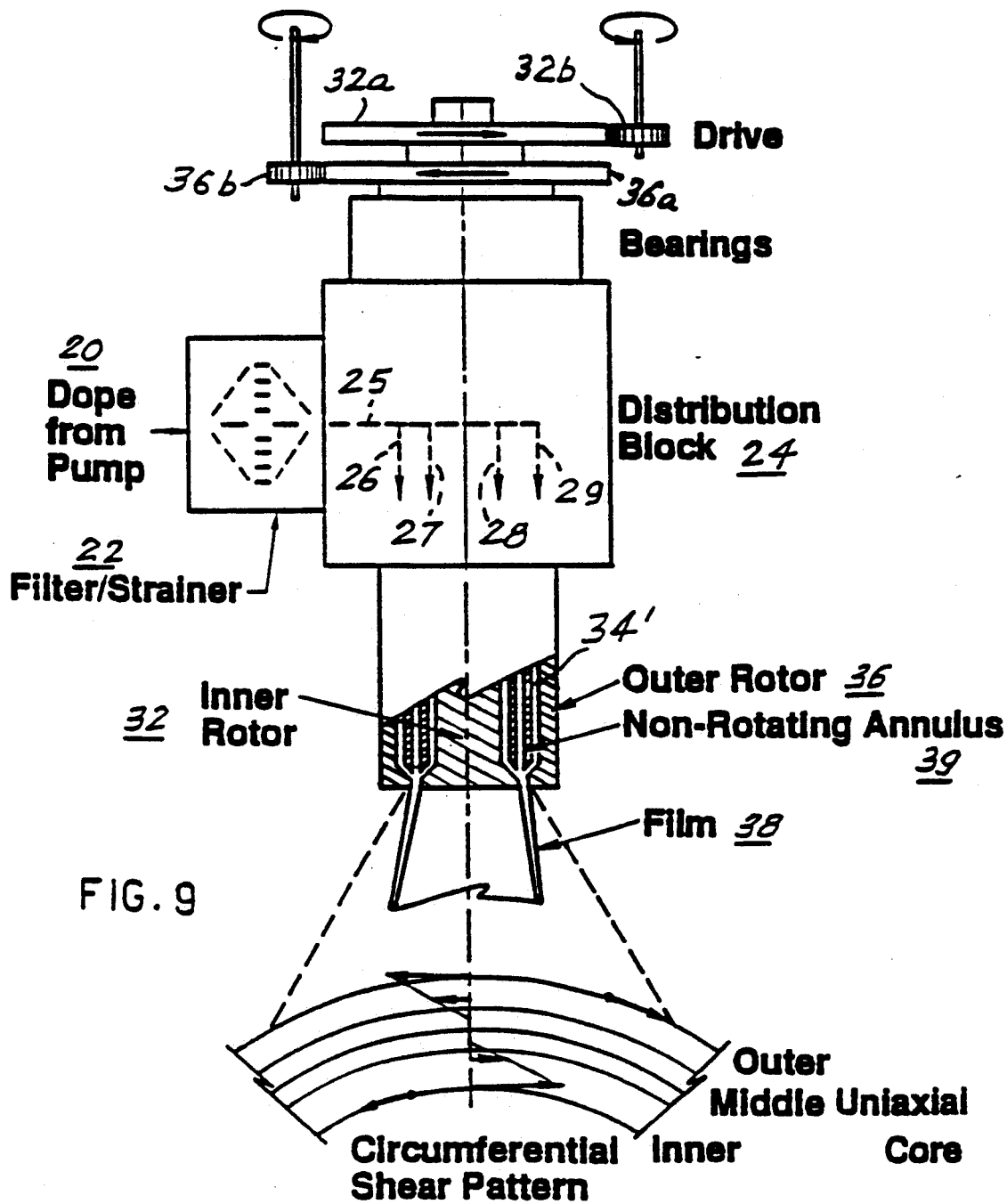
FIG. 9 shows a tri-axial (three-annulus) die which is a modification of the embodiments shown in FIGS. 1 and 4-6.

FIG. 9 illustrates another aspect of the invention. FIG. 9 shows a tri-axial (three-annulus) die which is a modification of the embodiments shown in FIGS. 1 and 4-6. Only the portions of this embodiment which differ from those in the first embodiment will be discussed, to eliminate redundant explanation In this embodiment, the inner rotor 32 and the outer rotor 36 are driven by the corresponding gearing 32a, 32b, 36a, 36b in opposite directions. A non-rotating member 34' is disposed between the inner and the outer rotors in a position corresponding to that of the middle rotor 34 in FIG. 1. A coaxial annular passage is formed through the non-rotating member 34'. The orientation of the film produced by this die is shown at the bottom of FIG. 9 and also in FIG. 10. A substantial central core layer of the film, which may constitute about 90% of its thickness, is oriented in the machine direction. The polymer material supplied to the inner annulus 33 and outer annulus 35, acted on by the counter-rotating inner rotor 32 and outer rotor 36, create relatively thinner surface layers which each may constitute approximately 5% of the thickness of the film. These surface layers are oriented in complementary directions with respect to the machine direction At the surface of the film, the orientation advantageously is plus/minus 45°. The angle of orientation is reduced gradually between the surface and the central core layer, whereby the direction of orientation gradually becomes the machine direction.

It should be recognized that the flow streams in the three coaxial annular passages do not have to consist of the same polymer Of polymer blend. For example, an ordered polymer could flow in the annulus 39 while a blended polymer or a coil-like polymer could flow in the outer and inner annuli 33 and 35. Co-extrusion is known in the art, but it is not typically practiced with apparatus as shown in FIG. 9.

The extrudate formed according to FIGS. 9 and 10 can be slit to form a film or can be left in tubular form. The substantial, nearly uniaxial central core layer gives the resulting film or tube greater tensile and compressive strength (Young's modulus) in the machine direction than products produced with conventional methods and apparatus. The strength of the tubing or film is increased depending on the amount of material passing through the non-rotating annulus 39. For example, if less strength but more flexibility is needed, less material could be supplied through the non-rotating annulus 30. This embodiment produces an extremely strong tube or film which has some of the advantages of a balanced biaxial film and also enhanced strength due to the uniaxial central core layer.

Fifth Embodiment

According to another form of the invention, the embodiment of FIGS. 1 and 4–6 can be modified by providing a middle annulus 39' formed within the middle rotor 34. Material is supplied from a pump 3 designated 53 through a passage 54a, 54b, this passage in turn being sealed by an additional seal 92.

Figure 11:
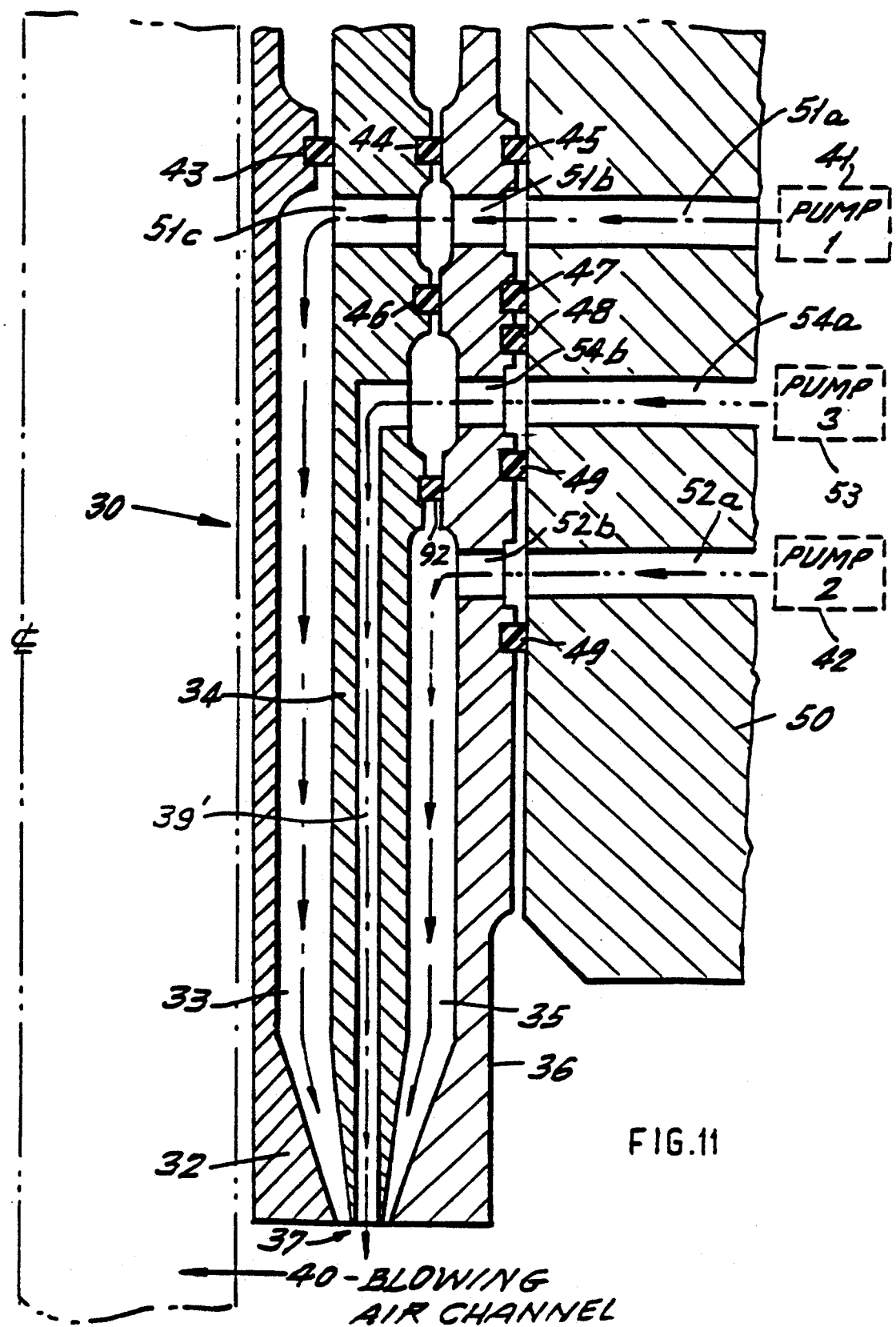
FIG. 11 shows a die with a middle annulus which is a modification of the embodiment of FIGS. 1 and 4-6.

In the apparatus of FIG. 11, preferably, the middle rotor 34 is rotated slowly, to minimize the spiraling orientation of the central core layer which results from the rotation of the middle rotor 34. The outer and inner rotors 32, 36 preferably rotate together, at the same rotational speed, but in the opposite direction, creating a shear pattern as shown in FIG. 12 The outer and inner rotors preferably rotate at a higher rotational speed than the middle rotor.

In FIG. 12, the central core layer 93 is sheared slightly by the motion of the middle rotor and thus is oriented at a small angle which will be defined as a negative angle with respect to the machine direction. The respective outer layers 95a, 95b are preferably oriented at a positive angle of at least 45° to the machine direction. The angle of orientation of the surface layers should be made as large as possible. A gradual transition between the positive angle of the surface layers 95a, 95b and the core layer 93 occurs in the intermediate layers 94a, 94b.

Coextrusion of different ordered polymers, coil-like polymers and blended polymers is possible in this embodiment as it was in the previous embodiment. Again, coextrusion is generally known, but it is not typically practiced with apparatus as shown in FIG. 11.

Although the invention has been described herein with respect to specific embodiments and aspects thereof, the appended claims are not limited to the disclosure, but are to be construed as embodying all modifications and variations that may occur to one of ordinary skill in the art which fairly fall within the basic teachings set forth herein.

What is claimed is:

1. A multiaxially oriented film prepared from high molecular weight liquid crystalline lyotropic or thermotropic polymer, having two substantially parallel and flat main surfaces and having a controlled molecular orientation in substantially any plane of said film, which orientation in each plane is defined by a selected positive or negative angle with respect to a longitudinal axis of said film, said film having planar surfaces regions wherein said angles defined by said molecular orientation generally have values defined as positive, and said film having an inner region with respect to said surface regions wherein said angles generally have negative values, said film having a nearly uniform coefficient of thermal expansion in all planar directions.

2. A film as in claim 1, wherein said regions are constituted by forming two individual intermediate-product films each having a substantially biaxial orientation, and then laminating said intermediate films in a continuous process to form said film having said regions.

3. A film as in claim 2, wherein said intermediate-product films are biaxial films formed by employing respective two-rotor counter-rotation dies whose rotors have opposite directions of rotation, and wherein the molecular orientation angles of the facing laminated surfaces are substantially equal.

4. A film as in claim 1, wherein said inner region is a portion of an integral film structure formed by a single die-forming process.

5. A film as in claim 4, wherein said integral film structure is formed by employing a tubular die having three concentric rotors which form two annular flow channels therebetween; supplying the polymer through said channels; rotating the outer and inner rotors in a first direction while rotating the middle rotor in the opposite direction; and joining the respective polymer films formed in said channels to form said integral film structure.

6. A film as in claim 5, wherein said polymer is a blend of said lyotropic or thermotropic polymers and a coil polymer.

7. A film as in claim 1, wherein each said surface region is relatively thin and said surface regions are substantially equal in thickness, while said inner region is thicker than each said surface region.

8. A film as in claim 7, wherein the maximum positive and negative angles are substantially equal with respect to said longitudinal axis.

9. A film as in claim 8, wherein said maximum angles are substantially $+/-45°$.

10. A film as in claim 1, wherein said molecular orientation on one side of the midplane of the film is substantially a mirror-image of the orientation on the other side of the midplane.

11. A film as in claim 1, wherein said polymer is lyotropic.

12. A film as in claim 11, wherein said lyotropic polymer is selected from the group consisting of poly-(p-phenylene benzobisoxazole), poly-(p-phenylene benzobisthiozole), and poly-(p-phenylene benzobisimidazole).

13. A film as in claim 1, wherein said polymer is thermotropic.

14. A film as in claim 13, wherein said polymer is a paraoriented aromatic polyester.

15. A film as in claim 1, wherein said polymer is a blend of said lyotropic or thermotropic polymers and a coil polymer 16. A method of preparing a multiaxially oriented film from high molecular weight liquid crystalline lyotropic or thermotropic polymers comprising the steps of:
   (a) subjecting axially flowing liquid crystalline polymer material to transverse-directional motions, thereby straining the axial flow; and
   (b) solidifying the microscale structural orientation formed in step (a), wherein said film is formed by first forming two individual intermediate-product films each having a substantially biaxial orientation, and then laminating said intermediate films in a continuous process to form said film having planar surface regions defined by positive molecular orientation angle and an inner region define negative molecular orientation angle, with respect to the longitudinal axis.

17. A method as in claim 16, wherein said intermediate-product films are biaxial films formed by employing respective two-rotor counter-rotation dies whose rotors have opposite directions of rotation, and wherein the molecular orientation angles of the facing laminated surfaces are substantially equal.

18. A method as in claim 16, wherein said regions are respective portions of an integral film structure formed by a single die-forming process.

19. A method as in claim 18, wherein said integral film structure is formed by employing a tubular die having three concentric rotors which form two annular flow channels therebetween; supplying the polymer through said channels; rotating the outer and inner rotors in a first direction while rotating the middle rotor in the opposite direction; and joining the respective polymer films formed in said channels to form said integral film structure.

20. A method as in claim 16, wherein said film is formed by passing said polymer axially through a die which defines a cross-sectional area of said polymer flow; said die having slits at opposing transverse sides of said die; and passing a continuous belt through said slits and through said polymer flow in only one direction, substantially bisecting said cross-sectional area of said polymer flow, thereby setting up a transverse shear pattern at a middle layer of the flow and oppositely directed transverse shear patterns across the sides of the die not having the slits.

21. A method as in claim 20, wherein the die defines an elongated rectangular cross-section of the polymer flow, said slits being at short sides of said cross-section, and said continuous belt passing parallel to longer sides of said cross-section.

22. A method as in claim 16, comprising the step of forming the film such that molecular orientation on one side of the midplane of the film is substantially a mirror-image of the orientation on the other side of the midplane.

23. A method as in claim 16, wherein said polymer is lyotropic and said material is a dope containing said polymer.

24. A method as in claim 16, wherein said polymer is thermotropic and said material is a melt of said polymer.

25. A method as in claim 23, wherein said lytropic polymer is selected from the group consisting of poly-(p-phenylene benzobisoxazole), poly-(p-phenylene benzobisthiozole), and poly-(p-phenylene benzobisimidazole).

26. A multiaxially oriented liquid crystalline film exhibiting a nearly uniform coefficient of thermal expansion in all planar directions prepared from high molecular weight liquid crystalline lyotropic or thermotropic polymers, having a controlled molecular orientation in substantially any plane of said film, which orientation in each plane is defined by a selected positive or negative angle with respect to a longitudinal axis of said film, said film having two surface layers, one said surface layer having a positive angle defined by said molecular orientation, the orientation of the other surface layer being negative, and said film having a central core layer wherein said orientation is generally along said longitudinal axis, wherein said layers are respective portions of an integral film structure formed by a single die-forming process, and wherein said film is formed by employing a tubular die having at least three concentric mandrels including outer, inner, and middle mandrels which form two annular flow channels therebetween, and a third annular flow channel, within said middle mandrel; supplying the polymer through said channels; rotating at least the outer and inner mandrels; and joining the respective polymer films formed in said channels to form said film.

27. A film as in claim 26, wherein the maximum positive and negative angles are substantially equal with respect to said longitudinal axis.

28. A film as in claim 27, wherein said maximum angles are substantially +/−45°.

29. A film as in claim 26, wherein the molecular orientation on one side of the midplane of the film is substantially a mirror-image of the orientation on the other side of the midplane.

30. A film as in claim 26, wherein said polymer is lyotropic.

31. A film as in claim 30, wherein said lyotropic polymer is selected from the group consisting of poly-(p-phenylene benzobisoxazole), poly-(p-phenylene benzobisthiozole), and poly-(p-phenylene benzobisimidazole).

32. A film as in claim 26, wherein said polymer is thermotropic.

33. A film as in claim 32, wherein said polymer is a paraoriented aromatic polyester.

34. A film as in claim 26, wherein said polymer is a blend of lyotropic or thermotropic polymers and a coil polymer.

35. A film as in claim 26, wherein said polymer includes a plurality of different selected ordered or coil polymers or blends in respective layers within said film.

36. A multiaxially oriented liquid crystal polymer film structure from high molecular weight liquid crystalline lyotropic or thermotropic polymers comprising two outer surface layers which are oriented generally in a first controllable direction; two intermediate layers respectively inward of said outer surface layers which are oriented generally in a second controllable direction; and a central core layer sandwiched between said intermediate layers which is oriented generally in a third controllable direction, said film having a nearly uniform coefficient of thermal expansion in all planar directions.

37. A film as in claim 36, wherein the central core layer is oriented in or close to the machine direction.

38. A film as in claim 37, wherein the intermediate layers have an orientation which is complementary to that of the adjacent outer layers.

39. A film as in claim 38, wherein the respective directions of orientation of each outer surface layer and the adjacent intermediate layer define equal and opposite angles with respect to the machine direction in which the extrusion is carried out.

40. A film as in claim 37, wherein the direction of orientation of each intermediate layer is between that of the adjacent outer layer and that of the central core layer, thus providing a gradual change of direction from the outer layers to the central core layer.

41. A film as in claim 37, wherein the respective directions of orientation of the outer surface layers and the intermediate layers define equal and opposite angles with respect to the machine direction in which the extrusion is carried out.

42. A method of preparing a multiaxially oriented film from a high molecular weight liquid crystalline lyotropic or thermotropic polymers and having a controlled molecular orientation in substantially any plane of said film comprising the steps of:

employing a tubular die having at least three concentric mandrels including outer, inner, and middle mandrels which form two annular flow channels therebetween, and a third annular flow channel within said middle mandrel; supplying the polymer through said channels; rotating at least the outer and inner mandrels; and joining the respective polymer films formed in said channels to form said film.

43. A method as in claim 42, wherein said outer and inner mandrels are rotated in the same direction.

44. A method as in claim 43, wherein said middle mandrel is rotated more slowly than said outer and inner mandrels and said middle mandrel is rotated in a direction opposite the rotational direction of said outer and inner mandrels.

45. as in claim 42, wherein said outer and inner mandrels are rotated in opposite directions.

46. A method as in claim 45, wherein said middle mandrel is not rotated.

47. A method as in claim 43 or claim 45, wherein said polymer is lyotropic and said quantity is a dope containing said polymer.

48. A method as in claim 43 or claim 45, wherein said is thermotropic and said quantity is a melt of said polymer.

49. A method as in claim 43 or claim 45, comprising the step of forming the film such that molecular orientation on one side of the midplane of the film is substantially a mirror-image of the orientation on the other side of the midplane.

50. A method as in claim 43 or claim 45, wherein said polymer is a blend of lyotropic orthermotropic polymers and a coil polymer.

51. A method as in claim 43 or claim 45, wherein said polymer includes a plurality of different selected lyotropic or thermotropic coil polymers in respective layers within said film.

* * * * *